United States Patent [19]

Raj et al.

[11] Patent Number: 5,414,726
[45] Date of Patent: May 9, 1995

[54] PROCESS AND APPARATUS FOR THE MODULATION AND AMPLIFICATION OF LIGHT BEAMS

[76] Inventors: Rama Raj, 9 Rue de la Clef, 75005 Paris; Marcel Bensoussan, 881 Coius Apuitaine, 92100 Boulogne; Jean-Louis Oudar, 22, rue des Torques, 92290 Chatenay-Malabry; Juan-Ariel Levenson, 8, rue Georges Saché, 75014 Paris, all of France

[21] Appl. No.: 75,673

[22] Filed: Jun. 11, 1993

[30] Foreign Application Priority Data

Jun. 15, 1992 [FR] France ............... 92 07182

[51] Int. Cl.⁶ .............. H01S 3/085; H01S 3/094; H01S 3/19; G02F 1/015
[52] U.S. Cl. .............. 372/26; 372/45; 359/244; 359/243; 359/260; 359/344; 359/345; 359/346
[58] Field of Search .............. 372/26, 27, 45, 50; 359/248, 260, 344, 345, 346, 244, 243

[56] References Cited

U.S. PATENT DOCUMENTS

| | | | |
|---|---|---|---|
| 4,518,934 | 5/1985 | Venkatesan | 359/243 |
| 4,597,638 | 7/1986 | Chemla et al. | 359/244 |
| 5,001,523 | 3/1991 | Lomashevitch et al. | 359/344 |
| 5,008,717 | 4/1991 | Bar-Joseph et al. | 372/45 |
| 5,132,982 | 7/1992 | Chan et al. | 372/45 |
| 5,309,275 | 5/1994 | Nishimura et al. | 359/344 |
| 5,323,019 | 6/1994 | Dutta et al. | 359/248 |

FOREIGN PATENT DOCUMENTS

| | | |
|---|---|---|
| 0155802 | 9/1985 | European Pat. Off. . |
| 0384764 | 2/1990 | European Pat. Off. . |
| 56-32785 | 6/1981 | Japan . |
| 63148687 | 12/1986 | Japan . |
| 4060522 | 6/1990 | Japan . |
| 8403397 | 8/1984 | WIPO . |

OTHER PUBLICATIONS

Proceedings of the Conference on Physical Concepts of Materials for Novel Optoelectronic Device Application II: Device Physics and Applications, Oct. 1990, Aachen, Germany, pp. 24–37, Larry A. Coldren et al.
Applied Physics Letters, vol. 55, No. 18, Oct. 30, 1989, New York, US pp. 1817–1819, A. Tomita et al.

*Primary Examiner*—Rodney B. Bovernick
*Assistant Examiner*—Robert McNutt

[57] ABSTRACT

A process and apparatus for the modulation and amplification of light beams having at least one input light beam (8) supplied to at least one Fabry-Perot resonator having at least one resonance mode, and defined by two mirrors (M1,M2) and produced by stacking layers on a substrate (4). At least one of the layers form an active medium (6) able to amplify the input light beam by stimulated emission, the wavelength thereof being around the resonance of the resonator and the density of free charge carriers in the active medium being varied in such a way as to make the latter sometimes absorbent and sometimes an amplifying with respect to the input beam and thus obtain at least one output light beam (10) whose intensity is modulated and amplified relative to the input beam. Application to optical telecommunications and to optical interconnections.

25 Claims, 5 Drawing Sheets

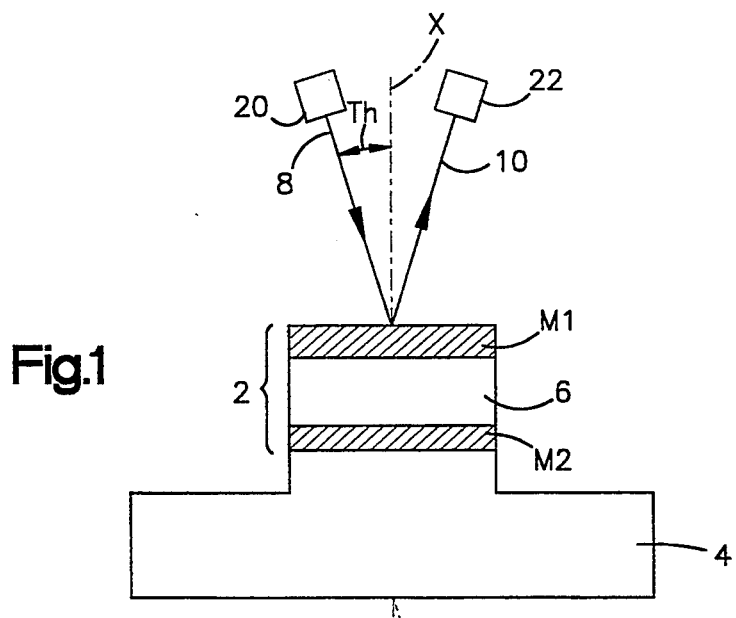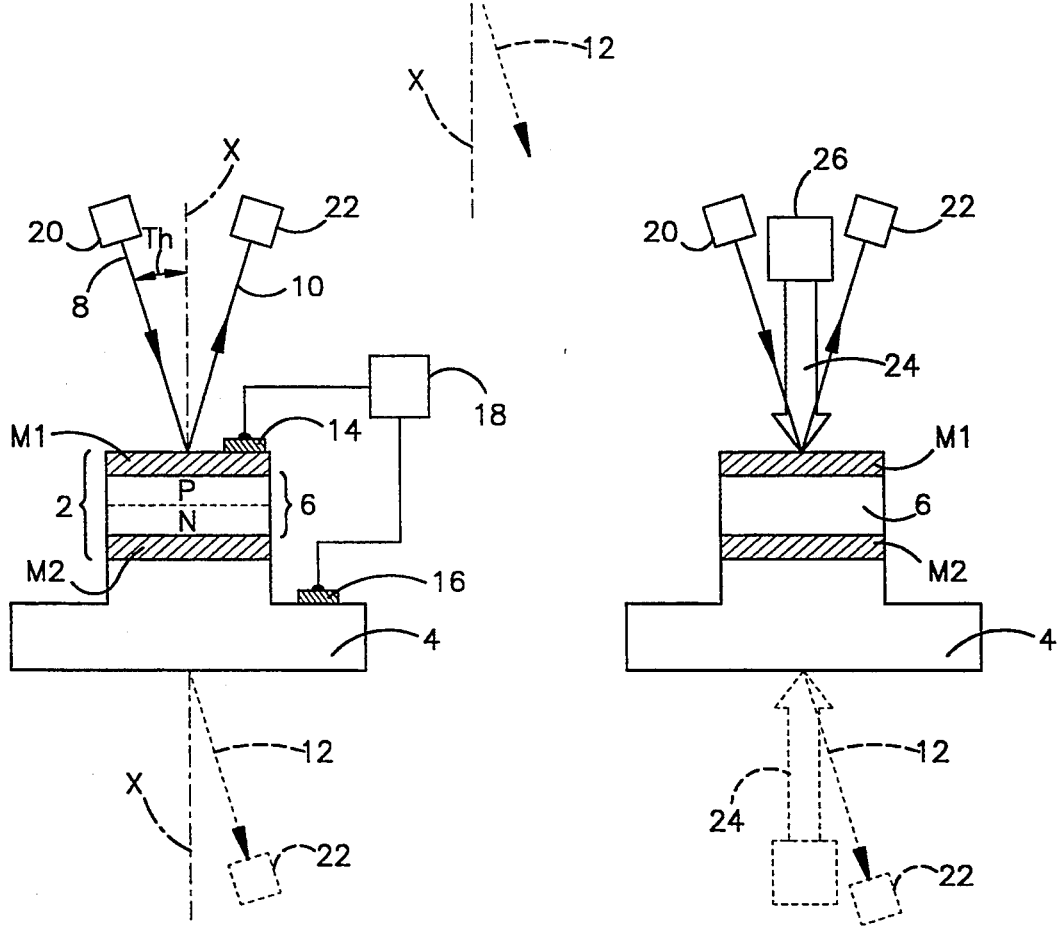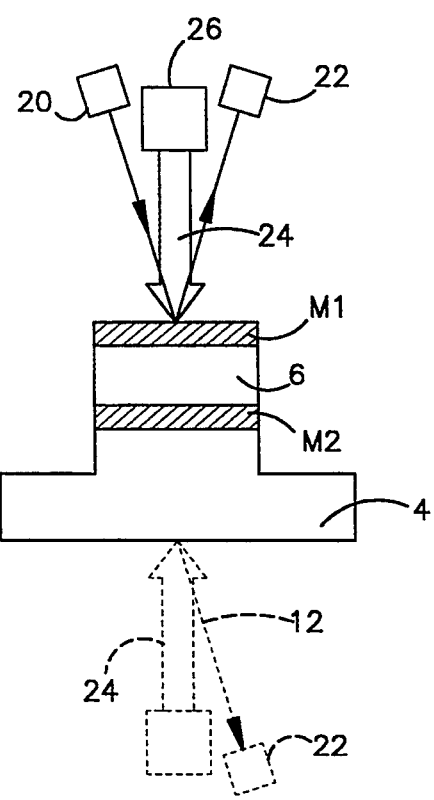

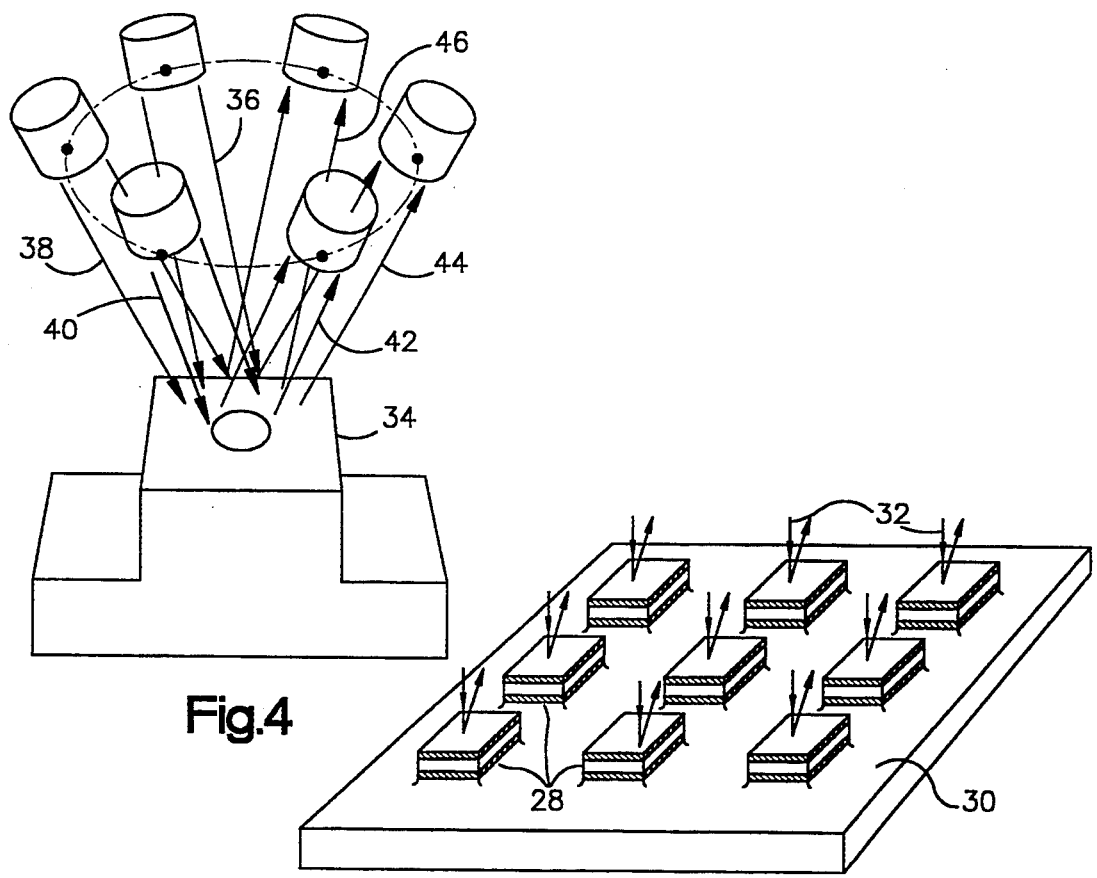
Fig.4
Fig.5
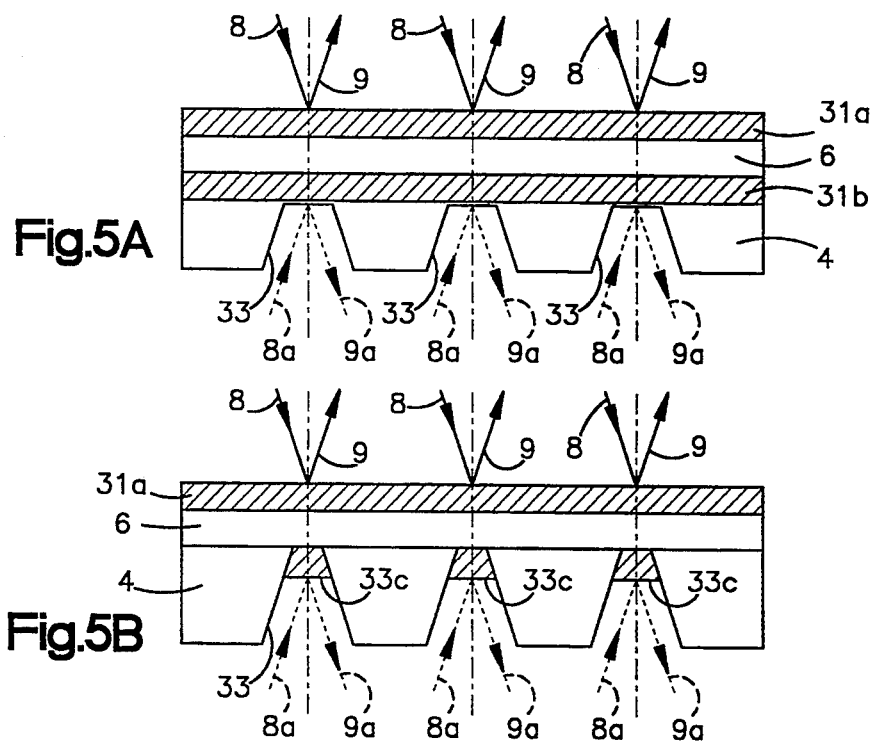
Fig.5A
Fig.5B

PROCESS AND APPARATUS FOR THE MODULATION AND AMPLIFICATION OF LIGHT BEAMS

BACKGROUND OF THE INVENTION

The present invention relates to a process and an apparatus for the modulation and amplification of light beams.

It more particularly applies to the processing of optical signals for optical telecommunications, for "intrachip" and "inter-chip" optical interconnections and for neuronal networks.

Multilayer structure photon devices with perpendicular access to the layers and which are known as "vertical structures", constitute one of the most appropriate technical approaches for utilizing parallelism and for taking optimum advantage of the very high flow rates allowed by optical links.

A new class of components based on the use of a vertical Fabry-Perot resonator or cavity has recently been developed in III-V semiconductors for producing:
lasers (cf. documents (1) and (2) which, like the other documents referred to hereinafter, are listed at the end of the description),
optical thyristors (cf. document (3)),
bistable devices (cf. document (4)),
modulators (cf. documents (5) and (6)) and
optical gates (cf. document (6)).

In most of these structures, the front and rear mirrors of the cavity or resonator are constituted by stacks of periodic "quarter wave" multilayers so as to obtain the optimum reflectivity necessary for the operation of such devices.

The majority of known modulators of this type make use of the electroabsorption effect linked with the Stark effect in multiple quantum wells, or the Wannier-Stark effect in superlattices, namely the optical absorption variations induced by an electric field. Thus, they are electric control modulators (cf. document (5)).

"All-optical" Fabry-Perot multilayer structure modulators are also known, in which the optical absorption variations are induced by an optical control beam (cf. document (6)).

Modulators are also known, which integrate a Fabry-Perot multilayer structure and a heterojunction phototransistor able to switch an optical beam by means of another lower intensity optical beam, the gain being supplied by the phototransistor (cf. document (7)).

The modulators which at present have the best performance characteristics from the standpoint of contrast between the "off" state and the "on" state are those which take advantage of the combination of the variations of the electrically or optically induced optical absorption and the resonances in a Fabry-Perot cavity surrounding an active medium.

The characteristics of the resonator or cavity (reflectivity of the front and rear mirrors and the size of the resonator or cavity) are calculated so that the reflectivity in the "off" state is virtually zero. In the "on" state, the reflectivity is not zero, but never reaches 100%, which leads to a prohibitive attenuation of the beam to be modulated, also known as "insertion loss", introduced by the modulator.

SUMMARY OF THE INVENTION

The aim of the present invention is to obviate this disadvantage by combining in the same apparatus and simultaneously an optical amplification function and an input beam modulation function, thus eliminating the insertion losses linked with the apparatus, while maintaining a good contrast between the "off" and "on" states.

The present invention relates to a process for the modulation of at least one light beam, wherein at least one input light beam is supplied to at least one Fabry-Perot resonator having at least one resonance mode, defined by two mirrors and produced by the stacking of layers on a substrate, at least one of these layers forming an active medium able to amplify the input light beam by stimulated emission, the wavelength of the input light beam being around the resonance of the Fabry-Perot resonator and in that the density of the free charge carriers in the active medium is varied so as to make the active medium sometimes absorbent and sometimes amplifying with respect to the input light beam, so as in this way to obtain at least one output light beam, whose intensity is modulated and amplified relative to the input beam.

In the case where the cavity is multimodal, it is possible to use a plurality of input beams of different wavelengths, each wavelength being chosen around one of the resonances of the cavity.

According to a special embodiment of the process according to the present invention, the stack of layers includes at least one P-N junction and the latter is biased directly while varying the P-N junction in such a way as to inject free charge carriers and obtain the variation of the free charge carriers in the active medium.

According to another special embodiment, a control light beam is fed into the active medium, the control light beam being absorbable by the active medium and optical pumping is carried out in the latter, the intensity of the control light beam being varied so as to obtain the variation of the density of the free charge carriers in the active medium.

According to another special embodiment, the wavelength of the input beam corresponds to the resonance of the cavity or resonator in the off state (or to one of the resonances of the cavity in the off state when the resonator or cavity is multimodal).

This permits a maximum extinction level in the case of a use of the resonator cavity in the reflection mode, in which the output beam is the input beam reflected on one of the mirrors of the resonator.

According to another embodiment, the wavelength of the input beam corresponds to the resonance of the cavity or resonator in the on state. This makes it possible, when using the cavity in the reflection mode, to take advantage of the maximum available gain.

According to another embodiment, in the active medium is established an electrical injection or stationary optical pumping regime and simultaneous action takes place on the active medium so as to bring about a gain switching to obtain the modulation of the output light beam.

The active medium can be excited so as to obtain a laser emission. In this case it is advantageous for the input light beam to have a non-zero incidence angle on one of the mirrors of the resonator, so that the laser emission does not disturb the detection of the output beam.

It is possible to supply a plurality of input light beams to the resonator, the input light beams having different incidence directions on one of the mirrors of the resonator and optionally different wavelengths, each wavelength being chosen either around one and the same resonance of the cavity or resonator, or around different resonances of the cavity if the latter is multimodal.

It is thus possible to apply the same modulation to said plurality of beams which will be differentiated either by their output direction or by their wavelength.

It is possible to supply a plurality of input beams respectively to a plurality of Fabry-Perot resonators forming a bidimensional array on the same substrate, so as to obtain a plurality of modulated and amplified output beams. These resonators can be identical to one another with respect to their characteristics or can have different characteristics.

The present invention also relates to an apparatus for the modulation of at least one light beam, the apparatus having at least one Fabry-Perot resonator having at least one resonance mode, defined by two mirrors and produced by stacking layers on a substrate, at least one of these layers forming an active medium able to amplify at least one input light beam by stimulated emission, the wavelength of the input light beam being around the resonance of the Fabry-Perot resonator and means for varying the density of the free charge carriers in the active medium, so as to make said active medium sometimes absorbent and sometimes amplifying with respect to the input light beam and in this way obtain at least one output light beam, whose intensity is modulated and amplified relative to the input beam.

The apparatus according to the invention has a certain fundamental analogy with the use of "horizontal cavity" semiconductor amplifiers as light modulators (cf. documents (8) and (9)).

In such known apparatuses, it is possible to obtain the modulation of a light intensity by varying the absorbing or amplifying character of an active layer, by modifying the density of the carriers in the active layer. However, compared with known semiconductor amplifier-modulators, the apparatus according to the invention has four essential advantages referred to hereinafter.

1. When it is used with normal incidence, the apparatus according to the invention is insensitive to the polarization or biases. This is particularly important for modulating signals, which have been either transmitted by an optical fibre and whose polarization bias state generally varies over a period of time, or emitted by a strongly polarized laser source.

2. The apparatus according to the invention has a Fabry-Perot resonator or cavity, which it was sought to avoid in known amplifier-modulators by depositing thereon antireflection layers. Due to the existence of said Fabry-Perot cavity or resonator in the apparatus according to the invention, the amplifying character of the active medium thereof can give rise to a laser emission, which is utilized in certain embodiments of the apparatus.

3. The light propagation in the apparatus according to the present invention is very different to the light propagation in known amplifier-modulators. Thus, in such a known apparatus, the light is propagated in a waveguide, whose axis is parallel to the substrate on which the apparatus is formed. This waveguide is generally transverse monomodal, so that the output beam can only have a single direction.

In the apparatus according to the present invention, the input beam and the output beam are directed perpendicular to the layers or obliquely with respect to the latter. Moreover, the limited length of the cavity or resonator of the apparatus according to the invention (small length which is linked with the small thickness of the layers of said apparatus) means that the modes of the cavity are widely spaced in the spectral range and have a relatively large natural width.

This spectral width is accompanied by a relatively high angular acceptance, which leads to a considerably greater flexibility of use than in the case of a long cavity or resonator.

For example, a microcavity having an active layer with a length of 0.36 micrometer, has an angular tolerance better than 5° in the vicinity of the normal incidence. It is therefore easy to deliver the input beam in accordance with an oblique incidence and recover in oblique reflection the amplified and modulated output beam.

The angular tolerance in particular permits the amplification of images. Onto an apparatus according to the invention can be supplied, by means of an appropriate optics, several light beams respectively coming from several optical fibers and respectively corresponding to pixels of a single image, in order to obtain amplified beams and therefore an amplified image.

4. The size and the "vertical" structure of the microresonators according to the invention are essentials for obtaining bidimensional arrays with a very high integration density, which cannot be the case with the aforementioned, known amplifier-modulators.

According to a special embodiment of the apparatus of the present invention, the active medium is in one or both the mirrors of the resonator.

According to another embodiment of the present invention, the active medium is between the two mirrors of the resonator. In this case, the apparatus can have at least one P-N junction and the means provided for varying the density of the free charge carriers in the active medium can be means able to directly bias said junction mad vary the P-N junction bias so as to obtain the modulation of the output beam.

The substrate of the apparatus can be transparent to the input light beam, so that the apparatus is usable in transmission or in reflection through the substrate.

If the substrate is absorbent with respect to the input light beam, the substrate can have one or more openings permitting the use of the apparatus in transmission or in reflection.

In all cases, the free face of the front mirror, which receives the input light beam, can also constitute the output face of the output light beam, so that the apparatus functions in reflection.

In this case of operation in reflection, according to a special embodiment of the present invention, the wavelength of the input light beam is a resonance mode of the resonator of the apparatus and the reflectivity of the mirror is below the reflectivity of the other mirror of the apparatus.

Once again in the case of the operation in reflection and according to another embodiment of the present invention, the wavelength of the input light beam is a resonance mode of the resonator of the apparatus and the reflectivity of the mirror is equal to or greater than the reflectivity of the other mirror of the apparatus.

The apparatus according to the invention can comprise a plurality of Fabry-Perot resonators forming a bidirectional array on the same substrate.

The apparatus can be produced from III-V semiconductor materials, which allows a microoptoelectronic integration with devices having complementary functionality.

Finally, at least one of the mirrors can be a dielectric multilayer, whose thickness need not be as great as that of a Bragg mirror produced with III-V materials, taking account of the possibilities of the very different index values offered by dielectrics.

BRIEF DESCRIPTION OF THE DRAWINGS

The invention is described in greater detail hereinafter relative to non-limitative embodiments and with reference to the attached drawings, wherein show:

FIG. 1 a partial, diagrammatic view of an apparatus according to the present invention.

FIG. 2 a diagrammatic view of a special embodiment of the apparatus according to the present invention having electrical control means.

FIG. 3 a diagrammatic view of another embodiment of the apparatus according to the present invention having optical control means.

FIG. 4 diagrammatically the modulation of several light beams by means of a single apparatus according to the present invention.

FIG. 5 is a diagrammatic view of an array of apparatuses according to the present invention.

FIGS. 5A and 5B diagrammatically the apparatuses according to the present invention, their substrate having openings.

DETAILED DESCRIPTION OF THE PREFERRED EMBODIMENTS

Figure 6:
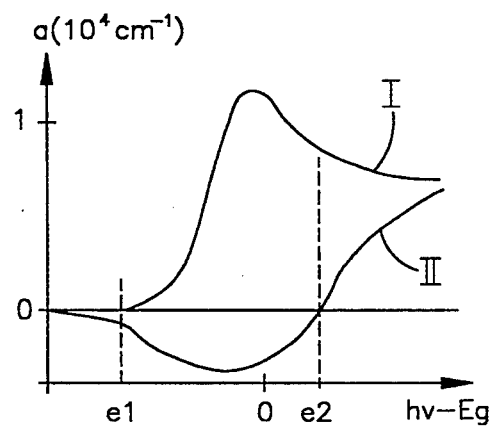
FIG. 6 is a graph showing the variations of the absorption coefficient as a function of the energy of an incident photon for two values of the density of the free charge carriers in the active medium of an apparatus according to the present invention (it should be noted that when the absorption becomes negative the medium is amplifying).

FIG. 1 diagrammatically and partially shows an apparatus according to the invention. The apparatus is in the form of a light modulator-amplifier and comprises a Fabry-Perot resonator 2 or cavity, which is produced by stacking thin layers or films on a substrate 4. These thin layers can be formed by epitaxy on the substrate or can be joined to the latter.

Certain of these layers are active layers able to amplify light by stimulated emission.

The cavity or resonator 2 (which can also be referred to as a microcavity or microresonator bearing in mind the thinness of the layers forming it) is defined by a front mirror M1 (by which the input beam has access to the apparatus) and by a rear mirror M2.

The plurality of active layers constitutes an active or amplifying medium, which can be distributed either throughout the complete apparatus, or in one of the cavity mirrors, or in both mirrors, or can be located between these said mirrors, the latter case being shown in FIG. 1, where the active medium carries the reference 6.

The front mirror M1 is partially transparent to permit the passage of part of an incident light beam 8 which it is wished to modulate and which is referred to as the input beam.

The apparatus of FIG. 1 supplies a modulated, amplified light beam 10, referred to as the output beam. FIG. 1 shows that the output beam 10 emerges from the front mirror M1 and that the apparatus operates in reflection.

If the substrate 4 is transparent with respect to the modulated, amplified light beam and if the rear mirror M2 is partly transparent relative to said modulated beam, the apparatus of FIG. 1 can operate in transmission. In this case, the modulated beam used is a beam 12 emerging from the lower face of the substrate 4 (opposite to that carrying the mirror M2).

The modulation and amplification of the intensity of the input beam are obtained by varying the density of the free charge carriers (electrons and holes) in the active medium 6, so as to modify over a period of time the absorbing or amplifying character of said active medium 6 with respect to the incident beam.

FIG. 2 diagrammatically illustrates an apparatus according to the invention, whose control is electrical. More specifically, the apparatus of FIG. 2 is like that of FIG. 1, but additionally a P-N junction is provided in the active medium 6.

An electrical contact 14 is provided on the upper face of the mirror M1 and another electrical contact 16 is provided on the substrate 4 (assumed to be able to conduct an electric current).

Control means 18 connected to the electrical contacts 14 and 16 serve to directly bias the P-N junction, while varying over a period of time the P-N junction bias in such a way as to obtain the desired modulation. In this case, the injection of the carriers is obtained by passing an electric current into the P-N junction.

FIG. 2 also shows a means 20 (optical fiber or light source) from which comes the beam 8 which it is wished to modulate and a means 22 (optical fiber or photodetector) which receives the modulated beam.

FIG. 3 diagrammatically illustrates the case where the apparatus described relative to FIG. 1 is controlled by a light beam 24, which comes from an appropriate source and has a wavelength such that it can be absorbed by the active medium 6. The control beam 24 can be fed into the active medium 6 through the mirror M1 (which is then constructed so as to at least partly permit the passage of said beam 24).

In the case where the substrate 4 and the mirror M2 are able to at least partly allow the passage of the control beam 24, the latter can be fed into the active medium 6 through the substrate 4 and the mirror M2. The control beam 24 is able to bring about an optical pumping in the active medium 6 as a result of its absorption by said medium. Therefore, the carrier density in the active medium 6 is again varied.

The source 26 is provided for varying the intensity of the control beam 24 which it emits, so as to modulate the output beam in the desired manner.

The speed with which it is possible to modify the carrier density in the active medium is obviously an important feature, because it governs the modulation pass band.

The stimulated emission process used in the apparatus of FIG. 2 and that of FIG. 3 makes it possible to speed up the recombination of the carriers and therefore obtain a large modulation pass band, which can exceed 10 GHz.

The operating wavelengths of an apparatus like that of FIGS. 2 and 3 are determined by the size of the cavity or resonator of said apparatus, by the construction of the front and rear mirrors of said cavity and by the nature of the material forming the active layers constituting the active medium of the apparatus. Moreover, for a given resonator or cavity, it is possible to adjust the operating wavelengths around one of the resonances of the cavity by slightly varying the angle of incidence Th of the input beam 8.

FIG. 4 diagrammatically illustrates the use of the same apparatus 34 according to the invention for modulating three input light beams 36,38,40. The modulated output beams corresponding to the beams 36,38,40 respectively carry the references 42, 44, 46 in FIG. 4. The incident beams 36, 38 and 40 can have identical or different wavelengths chosen from among the modes of the Fabry-Perot cavity of the apparatus.

In the case where the wavelengths of the input beams are identical, it is advantageous to have the same angle of incidence for all the beams, as indicated in FIG. 4.

In the case where the wavelengths of the input beams are different, it is possible for the maintenance of optimum performance characteristics with respect to each incident beam to individually adjust each incidence angle.

Due to the fact that the axis X of the cavity is perpendicular to the substrate 4, the structure of the apparatuses of FIGS. 1 to 4 is perfectly suitable for producing bidimensional arrays of modulators. This is illustrated in FIG. 5, where it is possible to see a bidimensional array of apparatuses 28 according to the invention produced on the same substrate 30 and able to modulate in parallel incident light beams 32.

The different modulators forming said bidimensional array can either be identical to one another or have different characteristics.

Such bidimensional arrays of modulators according to the invention make it possible to make use of the parallel processing of light beams of identical or different wavelengths made possible by the optics and therefore increase the overall processing speed of the light signals.

FIGS. 5A and 5B diagrammatically illustrate an apparatus according to the invention having an active medium 6 between two mirrors 31a, 31b on a substrate 4 in which openings 33 have been formed. Each opening defines an elementary modulator able to operate in the reflection mode or in the transmission mode and this no matter whether the mirror 31a or the mirror 31b is taken as the input front mirror. The input beams are designated 8 or 8a as a function of whether access to the modulators takes place via mirror 31a or mirror 31b.

The output beams 9 or 9a appear as a function of whether working takes place in the reflection mode or in the transmission mode with respect to the input beams.

In the case of FIG. 5A, the mirror 31a, the active medium 6 and the mirror 31b are firstly deposited on the substrate 4, in which openings are then made on the side opposite to the deposit until the mirror 31b is exposed.

The embodiment diagrammatically shown in FIG. 5B differs from that of FIG. 5A due to the fact that in the case of FIG. 5B it is the active medium 6 which is in contact with the opaque substrate 4, the mirror 31b then being in the form of several fragments 33a deposited at the bottom of the openings 33.

Details will be given hereinafter of the case where the active medium is inserted in the Fabry-Perot cavity or resonator of an apparatus according to the present invention. In this case, the characteristics of the modulation are influenced by the parameters of the resonator or cavity, namely the reflectivity R1 of the input front mirror M1 of the cavity, the reflectivity R2 of the rear mirror M2 of the cavity, the thickness of the active medium of the apparatus and the complex refractive index Nr of the active medium.

The real part n of said refractive index Nr governs the resonance condition of the cavity. The imaginary part K of said refractive index governs, as a function of its sign, the absorption or amplification of light. If K is positive there is absorption and if K is negative there is amplification. The complex refractive index Nr is dependent on the density of the carriers D injected into the active medium.

Such a modulation apparatus according to the present invention can in all cases be used in reflection.

Details will be given hereinafter of the case of reflection due to its general nature and the performance characteristics reached with it.

The reflectivity coefficient R of the microcavity of the apparatus according to the invention used in reflection is given by the following formula:

$$R = A/B \qquad (1)$$

with $A = (R1 - Ra)^2/R1 + 4\ Ra.\ \sin^2(phi)$
and $B = (1 - Ra)^2 + 4\ Ra.\ \sin^2(phi)$
in which $Ra = (R1.R2)^{\frac{1}{2}} \exp(-a.L/\cos Th)$
$phi = 2pi.n.L.(\cos Th)/l$
$a = 4\ pi.K/l$.

In the above, a represents the absorption coefficient per unit of length, L represents the length of the microcavity (starting parallel to the cavity axis X and therefore perpendicular to the substrate on which it is formed), The represents the angle of incidence of the input beam, phi the phase shift introduced by the cavity, l represents the wavelength (in vacuum) of the input light beam and pi the well known number representing approximately 3.14. The quantities n and a are dependent on the density of carriers D in the active medium and the wavelength 1.

Figure 7:
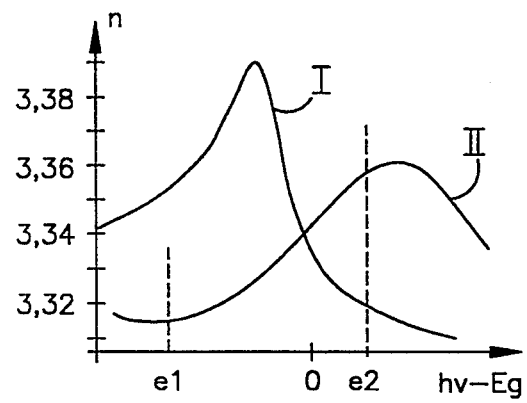
FIG. 7 a graph showing the variations of the real part of the refractive index of the active medium as a function of the energy of the incident photon for two values of the carrier density.

In FIGS. 6 and 7 (based on document (10)) are diagrammatically shown, for an active medium constituted by a multiple quantum well structure, the variations of a (FIG. 6) and n (FIG. 7), when D is zero (curves I) and when D is equal to $3 \times 10^{12}$ cm$^{-2}$ (curves II), as a function of the difference h.v−Eg between the energy h.v of an incident photon and the energy Eg of the forbidden band of the active layers constituting the active medium.

FIG. 6 shows that there is a spectral range between two values e1 and e2 of h.v−Eg, in which there is absorption or gain as a function of the injection level of the carriers, which determines the contrast between the on state and the off state of an apparatus according to the invention having said active medium.

If use is made of a light beam for controlling the apparatus, the frequency v1 of the light beam (which permits the optical pumping of the active medium) is chosen in such a way that h.v1 exceeds Eg and exceeds the energy hv of the photons of the beam to be modulated.

It is possible, by varying the composition of the active layers constituting the active medium, to choose their forbidden band energy Eg in such a way that Eg slightly exceeds the energy of the photons of the incident light. Thus, for example, Eg is chosen as approximately h.v+10 meV (h representing the Planck constant). In this case, a is a few hundred cm$^{-1}$, when the apparatus is inoperative (D=0).

When carriers are injected in a sufficient number into the active medium, a becomes negative and there is a gain coefficient per length unit, designated g with g=−a, which also reaches a value of a few hundred cm$^{-1}$. Thus, everything being otherwise equal, a contrast is obtained between the "off" state and the "on" state of a few dozen dB.

However, in the spectral range between e1 and e2 (cf. FIG. 7), the refractive index of the active medium varies with the injection. This displaces the resonance wavelength of the Fabry-Perot cavity and consequently also modifies the contrast between the "off" state and the "on" state to the wavelength of the input beam.

FIGS. 8 to 11 illustrate this effect in a simple case where a and n linearly vary with D in the equation (1).

Figure 8:
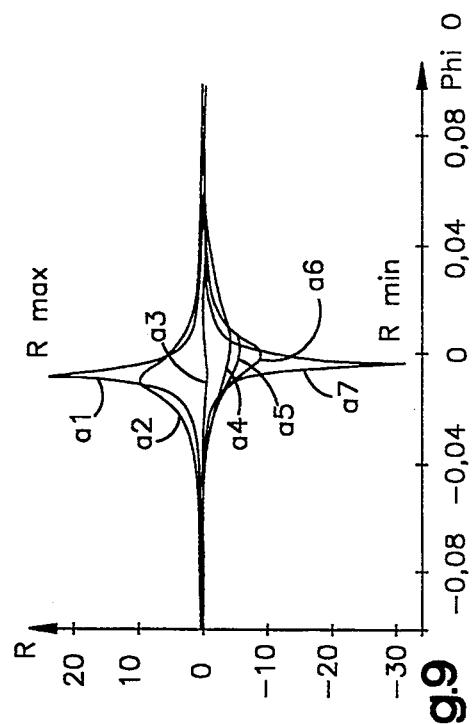
FIGS. 8 and 9, for a Fabry-Perot cavity or resonator of an apparatus according to the present invention, whose active medium is between two mirrors, the variations of the reflectivity coefficient of the cavity, as a function of a parameter linked with the phase shift introduced by the cavity, for various values of the absorption coefficient per length unit, in the case where the reflectivity of the rear mirror of the apparatus exceeds the reflectivity of the front mirror (FIG. 8) and in the opposite case (FIG. 9).

FIG. 8 shows the variations of the reflectivity R (expressed in dB) as a function of phio, the latter being equal to phi modulo pi for D=0, assuming that R1=0.92 and R2=0.98 (>R1) and this applies for various values of a, namely:

a1=−0.04; a2=−0.03; a3=−0.02; a4=−0.01; a5=0; a6=0.01; a7=0.02.

Figure 9:
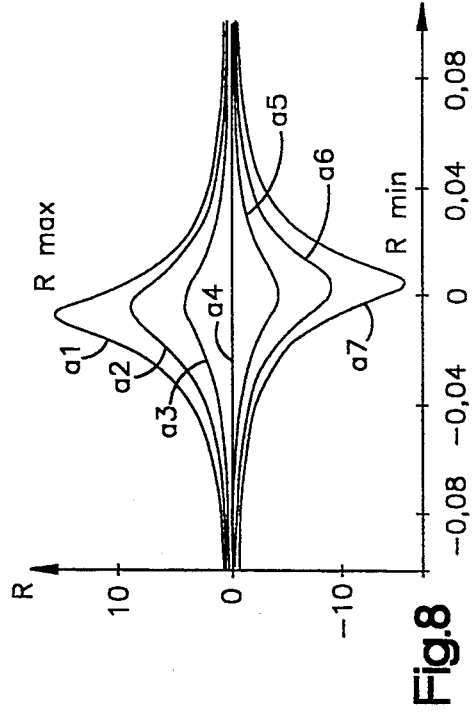

FIG. 9 shows the variations of R (dB) as a function of phio for various values of a1 to a7 of the parameter a referred to hereinbefore and in the case where R1 is equal to 0.98 and R2 to 0.96 (<R1).

Figure 10:
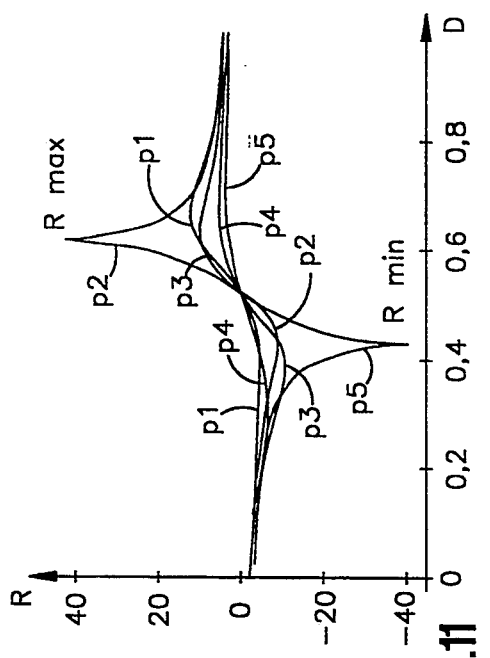
FIGS. 10 and 11 variations of said reflectivity coefficient of the cavity as a function of the carrier density, for different values of the phase shift introduced by the cavity, in the case where the reflectivity of the rear mirror of the apparatus exceeds that of the front mirror (FIG. 10) and in the opposite case (FIG. 11).

FIG. 10 shows the variations of R (dB) as a function of D when R1 is equal to 0.92 and R2 to 0.98 for various values p1 to p5 of phio, namely:

p1=−0.01; p2=−0.006; p3=−0.002; p4=0.002; p5=0.006.

Figure 11:
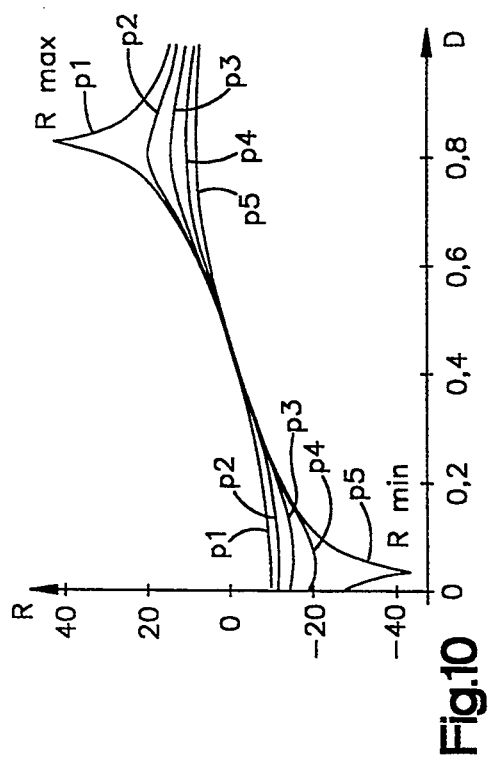

FIG. 11 shows the variations R (dB) as a function of D when R1 is equal to 0.98 and R2 to 0.96 for the same values p1 to p5 of the parameter phio.

For maximizing the contrast, phio and, therefore, the operating wavelength 1 can be chosen in the range between two values respectively corresponding to the maximum Rmax and the minimum Rmin of the reflectivity R indicated in FIGS. 8 and 9.

For continuing the discussion and for illustrating examples of uses of the apparatus, use will be made of a resonance mode of the Fabry-Perot cavity corresponding to the case where phi is an integral multiple of pi (then sin$^2$(phi)=0). Under these conditions, the equation (1) is simplified and there are two interesting operating points of the apparatus according to the invention.

1. Ra assumes the value R1 during operation, then the reflectivity is cancelled out and there is a perfect extinction. This condition Ra=R1 is obtained:
   a) when, in the presence of absorption, R1 is below R2. In this case the reflectivity of the modulating apparatus is close to zero (Rmin) in the absence of injected carriers and increases up to a value which can exceed 1 (Rmax) when a (which depends on D) becomes negative.
   b) when, in the presence of amplification, R1 is equal to or greater than R2. In this case, the reflectivity of the modulating apparatus in the absence of carriers, although below 1, is generally above 50%. However, when a (function of D) decreases and becomes negative, the reflectivity of the modulating apparatus passes through a minimum close to zero (Rmin) before increasing to values exceeding 1 (Rmax). The differential reflectivity dR/dD is consequently higher in the latter configuration (cf. FIGS. 10 and 11).
2. Ra assumes the value 1 during operation. The reflectivity of the modulating apparatus assumes a very high value. This condition can only be obtained under amplification conditions and corresponds to the threshold condition of laser emission.

Thus, it is possible to obtain both a very large modulation contrast and an amplification of the modulated signal.

In order to render maximum the modulation contrast, it is advantageous to realize the condition Ra=R1 when the active medium is slightly amplifying. This has the effect of minimizing the displacement of the resonance condition due to the variation of the refractive index with the carrier density (cf. FIG. 9).

It is even possible to cancel out this displacement by having an apparatus according to the present invention whose characteristics permit operation at the intersection point of curves I and II in FIG. 7.

With respect to the pass band of modulation of an apparatus according to the invention, it is possible to obtain a large modulation pass band by using the apparatus in a configuration where the amplification by stimulated emission permits laser emission. Provided that the carriers are injected sufficiently rapidly (gain switching conditions), the gain in the cavity can reach a value exceeding that under stationary conditions, but for a very short transient period (typically a few picoseconds).

The laser emission then occurs in the form of a very brief pulse due to the extremely short duration of an outward and return path of the light in the Fabry-Perot resonator or cavity (lasting 20 to 40 femtoseconds). At the end of this emission, the gain is significantly reduced and stabilizes at a value designated g0.

For a longer time scale, the residual carriers recombine by spontaneous emission and said gain is gradually transformed into absorption until the value a0 corresponding to D=0. In this case, when the laser emission occurs, it is appropriate to use the modulating apparatus in such a way that the laser beam produced is not superimposed on the modulated light beam.

This makes clear the interest of a use of the apparatus under oblique incidence. This is diagrammatically illustrated in FIG. 12, which partly shows an apparatus according to the invention incorporating an active medium 6 between two mirrors M1 and M2.

Figure 12:
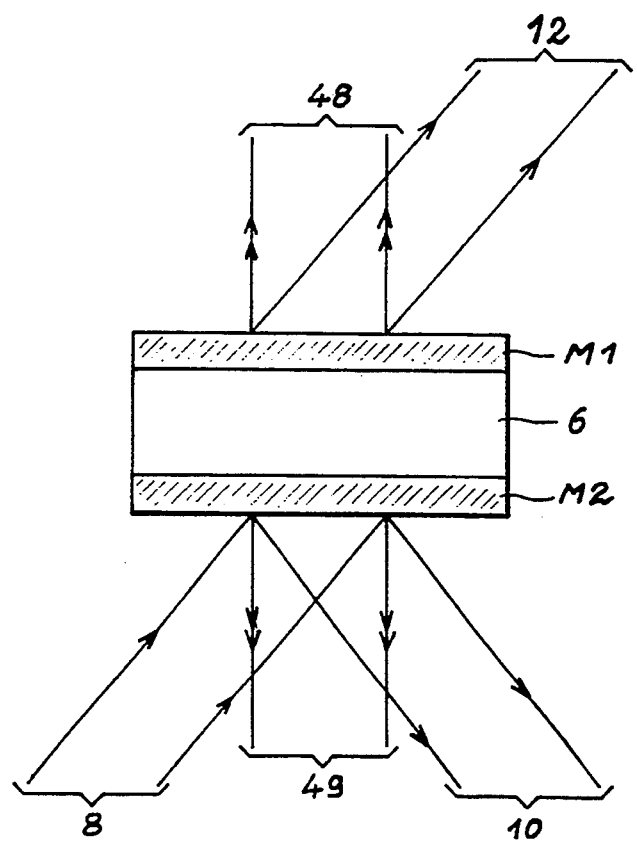
FIG. 12 diagrammatically and partly an apparatus according to the present invention supplying at the output a modulated light beam and which also produces a laser beam not superimposed on the modulated beam.

The not shown substrate of the apparatus is assumed to be transparent to the input beam 8, which is supplied under an oblique incidence to the mirror M2 in the example shown in FIG. 12.

A modulated beam 10 emerges from the mirror M2 (under an angle equal to the incidence angle of the beam 8) and another modulated beam 12 is available on the side of the mirror M1, as can be seen in FIG. 12.

The apparatus also emits laser beams 48,49 which are respectively perpendicular to the mirrors M1 and M2 and which are consequently not superimposed on the modulated beams.

For the operating speed of the modulating apparatus according to the invention, it is also preferable for R1 to be equal to or higher than R2 (cf. case 1b referred to hereinbefore), so as to obtain a high differential reflectivity and for example so as to cancel out the reflectivity of the apparatus in the case where the gain is stabilized at the value g0.

For such operating speed it is also preferable to make the apparatus operate in the "polarized mode", namely to apply thereto either a direct current, or an optical beam of continuous intensity (as a function of the control type of the modulating apparatus), so as to establish an electric injection or stationary optical pumping regime with a gain stabilized to the value g0.

The input light beam is then amplified and modulated by superimposing, at the desired modulating frequency, a pulsed voltage or a pulsed optical beam, which carries out the switching of the gain in the cavity and switches the output beam from the off state with high extinction to the on state with gain.

It should be noted that in this operating mode (polarized mode), the control for maintaining the stationary state with the gain g0 and the control for switching can be a combination of electrical injection and optical pumping as a function of the sought application (i.e. the control for maintaining the stationary state with the gain g0 can either be electrical or optical and the control for the switching can either be electrical or optical, which leads to four possibilities).

Experiments have been carried out consisting of measuring the reflectivity in a configuration with two pulsed optical beams (optical pumping beam and beam which it is wished to modulate), with pulse times of 15 ps.

These experiments have related to a Fabry-Perot structure, whose active layer is constituted by 130 GaAs/Al$_{0.7}$Ga$_{0.3}$As (10 nm/10 nm) quantum wells inserted between a pair of mirrors produced by a Bragg GaAs/AlAs stack with a reflectivity of 97.2% for the rear mirror and 91.7% for the front mirror. This cavity has a fineness of 15 and has five modes spaced by 21 nm.

This structure made it possible to obtain two important informations, one in the spectral region and the other in the time region. With regards to the spectral region, on fixing the wavelength of the optical pumping beam in a spectral range where the active medium is highly absorbent (wavelength of 785 nm) and the wavelength of the input beam (probe beam) is varied so as to scan all the resonances of the Fabry-Perot cavity (780 to 880 nm), for a pumping energy of 5mJ/cm$^2$ (corresponding to a carrier density of approximately 10$^{12}$ carriers per cm$^2$ in the active medium), there is an amplification of approximately 8 dB on the reflectivity of the probe at each resonance of the Fabry-Perot cavity.

The amplification factor is highly dependent on the density of the photoexcited carriers.

With regards to the time region, the introduction of a variable delay (from $-50$ to $+200$ ps) between the pulse of the probe beam and that of the pumping beam shows that for an adequate pumping energy, the amplification of the reflected probe beam only takes place for the duration of the pumping pulse (15 ps), thus demonstrating that a modulating apparatus according to the invention is able to operate at a modulating frequency higher than 10 GHz and is only limited by the duration of the pumping pulse.

In the present invention, the wavelength of use (wavelength of the input light beam) constitutes a fundamental parameter determining the choice of the active material, the construction of the mirrors and the size of the Fabry-Perot cavity of the apparatus.

Moreover, a good knowledge of the variations of a and n as a function of D permits the optimization of the apparatus from the gain and injection rate standpoints.

An apparatus according to the invention can be made from any material, provided that the latter can have a gain under carrier electrical injection or optical pumping conditions. This is possible with glasses doped with the aid of rare earths or with the aid of transition metals, using semiconductors, etc.

Moreover, the structure of such an apparatus can be hybrid or monolithic in the sense that it can be produced either by the deposition of thin layers of materials of different natures, or by the epitaxy of thin layers of materials from the same family, or by a combination of both.

Apparatuses according to the invention can in particular be produced from multilayers which are deposited by growth methods (M.B.E., C.B.E. or M.O.C.V.D.) for thin semiconductor layers of III-V, II-VI or IV-IV materials and which are then processed by conventional methods for the production of microoptoelectronic components. This is illustrated by the two examples given hereinafter.

Figure 13:
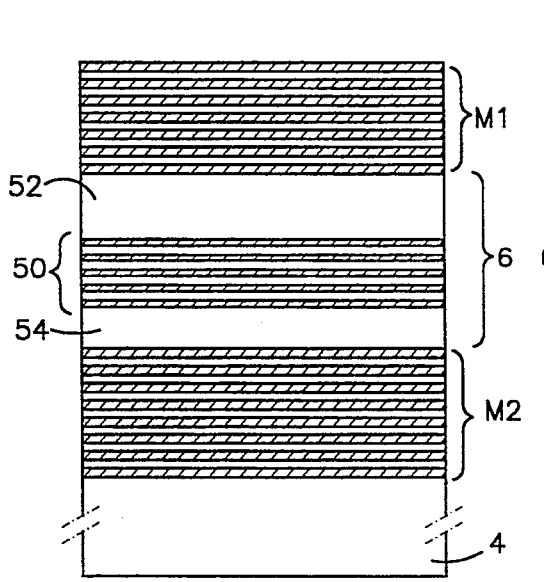
FIG. 13 diagrammatically and partially an apparatus according to the present invention operating in reflection and using an optical control.

The first example is diagrammatically illustrated by FIG. 13 and relates to a modulating apparatus according to the invention (modulator-amplifier) operating at 0.85 micrometer by optical pumping and in reflection. In this example, the substrate 4 is of GaAs.

The mirror M1 furthest removed from the substrate is a Bragg mirror constituted by m quarter wave layers (the thickness of a layer is equal to $1/(4 \cdot n)$, in which 1 is the wavelength of the input beam and n the real part of the complex refractive index of the material constituting said layer) made from GaAs alternating with m AlAs quarter wave layers, so that there are m GaAs-/AlAs periods.

The mirror M2, which rests on the substrate 4, is a Bragg mirror constituted by m GaAs quarter wave layers alternating with m AlAs quarter wave layers.

The number m can be between 5 and 25 and can differ between individual mirrors as a function of the sought assymetry between the two mirrors M1 and M2.

Between the mirrors M1 and M2 there is the active medium 6 constituted by a multiple quantum well structure GaAs/GaAlAs carrying the reference 50, so that the structure has AlGaAs barrier layers. This structure is inserted between two buffer layers of GaAlAs designated 52 and 54.

The thickness of the wells and barriers of the multiple quantum well structure is 10 nm. The thickness of the thus obtained cavity is determined by the operating wavelength.

The stack of layers constituting the mirrors and the active medium is obtained by epitaxy on the substrate 4 either by MBE or by MOCVD.

The front mirror M1 can be optionally replaced either by a dielectric multilayer, or by a very thin metal layer, so that it is partly transparent to the incident beam.

Figure 14:
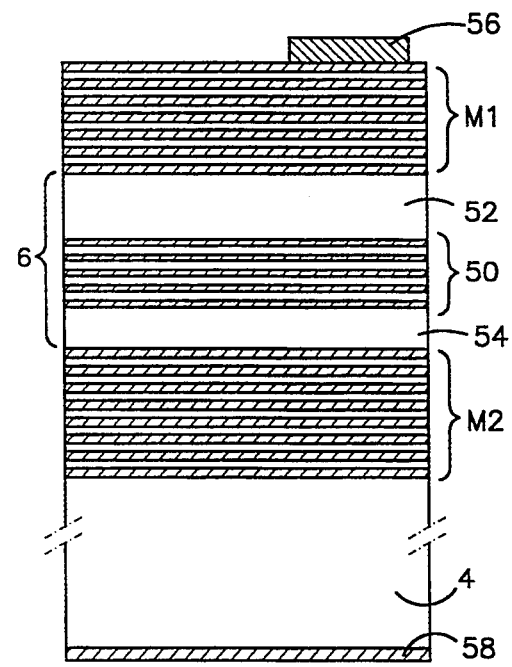
FIG. 14 diagrammatically and partially another apparatus according to the present invention operating in reflection and using an electrical control.

The second example is diagrammatically illustrated by FIG. 14 and relates to a modulating apparatus according to the invention operating at 0.85 micrometer by electrical injection and in reflection.

Other than the fact that the mirrors M1 and M2 are doped during growth in the case of FIG. 14, said apparatus is the same as that of FIG. 13.

For example, in the case of a type N GaAs substrate 4, the doping of mirror M1 is of type P and the doping of mirror M2 is of type N.

Still in the case of FIG. 14, the zone 50 containing the quantum wells is intrinsic, but the buffer zones 52, 54 located on either side of said zone 50 are doped in the same way as the adjacent mirrors. The buffer zone 52 is doped P like the mirror M1 and the buffer zone 54 is doped N like the mirror M2.

The apparatus of FIG. 14 also comprises electrical contacts 56, 58 for the direct polarization of the apparatus by appropriate means, as explained hereinbefore.

As can be seen in FIG. 14, the electrical contact 56 on the mirror M1 is placed on one edge of the apparatus, so as not to disturb the input and output beams.

In the embodiment of FIG. 14, the electrical contact 58 is formed on the rear face of the substrate 4 (face opposite to that carrying the mirror M2). These electrical contacts are produced by conventional metal deposition technologies for ohmic contacts N and P on III-V semiconductors.

Figure 15:
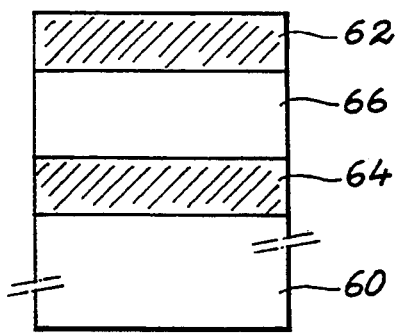
FIGS. 15 and 16 diagrammatically apparatuses according to the present invention, whose active medium is in at least one of the cavity mirrors.
Figure 16:
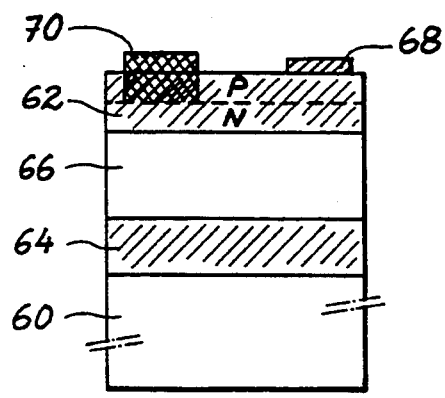

FIGS. 15 and 16 diagrammatically illustrate other apparatuses according to the invention in which the active medium is in one of the two mirrors of the Fabry-Perot cavity of the apparatuses or in both the said mirrors.

The apparatus of FIG. 15 has optical control and comprises, on a semiconductor substrate 60, two multilayer Bragg mirrors 62, 64. For one or both mirrors 62, 64, all the constituent layers, or every other layer, permit by optical pumping a stimulated emission and therefore an optical amplification at the wavelength of the input beam.

Between the two Bragg mirrors 62, 64, there is a passive material, i.e. a material not giving rise to the stimulated emission under the conditions of use.

FIG. 16 diagrammatically illustrates an apparatus according to the invention having an electrical control. This apparatus has the same structure as that of FIG. 15, but in the apparatus of FIG. 16, a P-N junction is also formed in whichever of the mirrors 62 and 64 contains the active medium and this is mirror 62 in the case shown. This mirror 62 has a N doped zone and a P doped zone, optionally with an intrinsic, zone (not shown) between them.

Two electrodes 68, 70 are respectively provided on the mirror 62 for contacting the P and N zones and for biasing in direct manner the P-N junction.

If the active medium is in the two mirrors 62 and 64, each of them can have a P-N junction. Each P-N junction is to be directly biased, the apparatus being provided with electrodes permitting such direct biases.

Cited Documents (1) Special issue on semiconductor lasers: vertical cavity Surface-Emitting Lasers., IEEE Journal Quantum Electronics, vol. 27, No. 6, pp. 1332–1417.

(2) Optically controlled surface-emitting lasers, W. K. Chou, J. P. Harbison, A. C. Von Lehmen, L. T. Florez, C. K. Nguyen, S. A. Sharz, Appl. Phys. Lett. 58 2342 (1991).

(3) Surface-emitting laser operation in vertical-to-surface transmission electrophotonic device with a vertical cavity, T. Numai, M. Sugimoto, I. Ogura, H. Kosaka, K. Kasahara, Appl. Phys. Lett. 58, 1250, (1991).

(4) High contrast multiple quantum well optical bistable device with integrated Bragg reflectors, B. G. Sfez, J. L. Oudar, J. C. Michel, R. Kuszelewicz, R. Azoulay, Appl. Phys. Lett. 57, 334, (1990).

(5) Electro absorption and refraction in Fabry-Perot quantum well modulators: a general discussion, G. D. Boyd, G. Luvescu, Optical and Quantum Electronics 24, 147, (1992).

(6) Optically addressed asymmetric Fabry-Perot modulator, A. Larsson, J. Maserjian, Appl. Phys. Lett. 59, (24), 3099, (1991).

(7) All-optical photonic switches using integrated inverted asymmetric Fabry-Perot modulators. and heterojunction phototransistors, Kezhong Hu, Li Chen, Klan Kavianai, Ping Chen, Anupam Madhukar, IEEE Photon. Technol. Lett. 4, 263, (1992).

(8) Amplifier modulation integrated with a cleaved-coupled-cavity injection laser, T. P. Lee et al., Elect. Lett. 20 (15), 625, (1985).

(9) Gain characteristic of a 1.5 um nonlinear split contact laser amplifier, I. W. Marshall et al., Appl. Phys. Lett. 53, 1577, (1988).

(10) Simplified calculation of the optical spectra of two and three dimensional laser excited semiconductors, C. Ell et al., J. Opt. Soc. Am. vol. 6, (11), 2006, (1988).

We claim:

1. Process for the modulation of at least one light beam, wherein at least one input light beam (8, 8a; 32; 36, 38, 40) is supplied to at least one Fabry-Perot resonator (2) having an off state and an on state and having at least one resonance mode, defined by two mirrors (M1, M2) and produced by stacking layers on a substrate (4, 30), at least one of said layers forming an active medium (6) able to amplify said input light beam by stimulated emission, a wavelength of the input light beam being around the resonance of the Fabry-Perot resonator and in that free charge carrier density in the active medium is varied so as to make said active medium sometimes absorbent and sometimes amplifying with respect to the input light beam and so as to obtain at least one output light beam (9, 9a; 10, 12; 42, 44, 46) whose intensity is modulated and amplified relative to the input light beam and wherein, in the amplification regime, the wavelength of the amplified output beam is the same as the wavelength of the incident input beam.

2. Process according to claim 1, wherein the stack of layers includes at least one P-N junction and in that the latter is directly biased while varying the P-N junction bias in such a way as to inject free charge carriers and obtain the variation of the density of the free charge carriers in the active medium (6).

3. Process according to claim 1, wherein a control light beam (24) is also fed into the active medium (6), said control light beam being absorbable by said active medium and appropriate for carrying out an optical pumping in the latter and in that intensity of the control light beam is varied so as to bring about the variation of the density of the free charge carriers in the active medium.

4. Process according to claim 1, wherein the wavelength of the input light beam corresponds to the resonance of the resonator in the off state.

5. Process according to claim 1, wherein the wavelength of the input light beam corresponds to the resonance of the resonator in the on state.

6. Process according to claim 1, wherein the active medium (6) is established an electrical injection or stationary optical pumping regime and in that simultaneous action takes place on the active medium so as to bring about a gain switching for obtaining the modulation of the output light beam (10,12;42,44,46).

7. Process according to claim 1, wherein the active medium (6) is excited so as to bring about a laser emission (48,49) from said active medium.

8. Process according to claim 1, wherein a plurality of input light beams are supplied respectively to a plurality of Fabry-Perot resonators forming a bidimensional array on the substrate, so as to obtain a plurality of modulated, amplified output beams.

9. Process for the modulation of at least one light beam, wherein at least one input light beam (8, 8a; 32; 36, 38, 40) is supplied to at least one Fabry-Perot resonator (2) having an off state and an on state and having at least one resonance mode, defined by two mirrors (M1, M2) and produced by stacking layers on a substrate (4, 30), at least one of said layers forming an active medium (6) able to amplify said input light beam by stimulated emission, a wavelength of the input light beam being around the resonance of the Fabry-Perot resonator and in that free charge carrier density in the active medium is varied so as to make said active medium sometimes absorbent and sometimes amplifying with respect to the input light beam and so as to obtain at least one output light beam (9, 9a; 10, 12; 42, 44, 46) whose intensity is modulated and amplified relative to the input light beam, wherein the resonator is multimodal and use is made of a plurality of input light beams of different wavelengths, each wavelength being chosen around one of the resonances of the resonator.

10. Process for the modulation of at least one light beam, wherein at least one input light beam (8, 8a; 32; 36, 38, 40) is supplied to at least one Fabry-Perot resonator (2) having an off state and an on state and having at least one resonance mode, defined by two mirrors (M1, M2) and produced by stacking layers on a substrate (4, 30), at least one of said layers forming an active medium (6) able to amplify said input light beam by stimulated emission, a wavelength of the input light beam being around the resonance of the Fabry-Perot resonator and in that free charge carrier density in the active medium is varied so as to make said active medium sometimes absorbent and sometimes amplifying with respect to the input light beam and so as to obtain at least one output light beam (9, 9a; 10, 12; 42, 44, 46) whose intensity is modulated and amplified relative to the input light beam, wherein the input light beam (8) has a non-zero incidence angle on one of the resonator mirrors.

11. Process for the modulation of at least one light beam, wherein at least one input light beam (8, 8a; 32; 36, 38, 40) is supplied to at least one Fabry-Perot resonator (2) having an off state and an on state and having at least one resonance mode, defined by two mirrors (M1, M2) and produced by stacking layers on a substrate (4, 30), at least one of said layers forming an active medium (6) able to amplify said input light beam by stimulated emission, a wavelength of the input light beam being around the resonance of the Fabry-Perot resonator and in that free charge carrier density in the active medium is varied so as to make said active medium sometimes absorbent and sometimes amplifying with respect to the input light beam and so as to obtain at least one output light beam (9, 9a; 10, 12; 42, 44, 46) whose intensity is modulated and amplified relative to the input light beam, wherein a plurality of input light beams (8, 8a; 32, 36, 38, 40) are supplied to the resonator, each of said input light beams having different incidence directions on one of the resonator mirrors.

12. Process according to claim 11, wherein said input light beams have different wavelengths, said wavelengths being chosen either around the same resonance of the resonator or around different resonances of the resonator if the latter is multimodal.

13. Apparatus for the modulation of at least one light beam, comprising at least one vertical cavity Fabry-Perot resonator having at least one resonance mode, defined by two mirrors (M1, M2) and produced by stacking layers on a substrate (4), at least one of these layers forming an active medium (6) able to amplify at least one input light beam (8, 8a; 32; 36, 38, 40) by stimulated emission, a wavelength of the input light beam being around the resonance of the Fabry-Perot resonator and means (18, 26) for making said active medium sometimes absorbent and sometimes amplifying with respect to the input light beam by varying a density of free charge carriers in the active medium and, in this way, obtaining at least one output light beam (9, 9a; 10, 12; 42, 44, 46) whose intensity is modulated and amplified relative to the input light beam.

14. Apparatus according to claim 13, wherein the active medium (6) is located between the two resonator mirrors (M1,M2).

15. Apparatus according to claim 14, further comprising at least one P-N junction and wherein the means provided for varying the density of the free charge carriers in the active medium are means able to directly bias said junction and vary the P-N junction bias in such a way as to obtain the modulation of the output light beam (9,9a;10,12;42,44,46).

16. Apparatus according to claim 13, wherein the substrate has at least one opening whose bottom contacts one of said mirrors.

17. Apparatus according to claim 13, wherein the resonator is designed so as to obtain laser emission.

18. Apparatus according to claim 13, comprising a plurality of Fabry-Perot resonators forming a bidimensional array on the substrate (30).

19. Apparatus according to claim 13, wherein it is made from III-V materials.

20. Apparatus according to claim 13, wherein at least one of the mirrors is a dielectric multilayer.

21. Apparatus for the modulation of at least one light beam, comprising at least one Fabry-Perot resonator having at least one resonance mode, defined by two mirrors (M1, M2) and produced by stacking layers on a substrate (4), at least one of these layers forming an active medium (6) able to amplify at least one input light beam (8, 8a; 32; 36, 38, 40) by stimulated emission, a wavelength of the input light beam being around the resonance of the Fabry-Perot resonator and means (18, 26) for making said active medium sometimes absorbent and sometimes amplifying with respect to the input light beam by varying a density of free charge carriers in the active medium and, in this way, obtaining at least one output light beam (9, 9a; 10, 12; 42, 44, 46), whose intensity is modulated and amplified relative to the input light beam, wherein the active medium is in at least one of the resonator mirrors (M1, M2).

22. Apparatus for the modulation of at least one light beam, comprising at least one Fabry-Perot resonator having at least one resonance mode, defined by two mirrors (M1, M2) and produced by stacking layers on a substrate (4), at least one of these layers forming an active medium (6) able to amplify at least one input light beam (8, 8a; 32; 36, 38, 40) by stimulated emission, a wavelength of the input light beam being around the resonance of the Fabry-Perot resonator and means (18, 26) for making said active medium sometimes absorbent and sometimes amplifying with respect to the input light beam by varying a density of free charge carriers in the active medium and, in this way, obtain at least one output light beam (9, 9a; 10, 12; 42, 44, 46), whose intensity is modulated and amplified relative to the input light beam, wherein the substrate (4) is transparent to the input light beam (8; 36, 38, 40), so that the apparatus is usable in transmission or in reflection through the substrate.

23. Apparatus for the modulation of at least one light beam, comprising at least one Fabry-Perot resonator having at least one resonance mode, defined by two mirrors (M1,M2) and produced by stacking layers on a substrate (4), at least one of these layers forming an active medium (6) able to amplify at least one input light beam (8, 8a; 32; 36, 38, 40) by stimulated emission, a wavelength of the input light beam being around the resonance of the Fabry-Perot resonator and means (18, 26) for making said active medium sometimes absorbent and sometimes amplifying with respect to the input light beam by varying a density of free charge carriers in the active medium and, in this way, obtaining at least one output light beam (9, 9a; 10, 12; 42, 44, 46), whose intensity is modulated and amplified relative to the input light beam, wherein one of said mirrors (M1) constitutes the input face of the input light beam (8; 36, 38, 40) as well as the output face of the output light beam (10; 42, 44, 46) so that the apparatus operates in reflection.

24. Apparatus according to claim 23, wherein the wavelength of the input light beam is a resonance mode of the resonator and in that the reflectivity of the one mirror (M1) is below the reflectivity of the other mirror (M2).

25. Apparatus according to claim 23, wherein the wavelength of the input light is a resonance mode of the resonator and in that the reflectivity of one mirror (M1) is equal to or greater than the reflectivity of the other mirror (M2).

* * * * *

UNITED STATES PATENT AND TRADEMARK OFFICE
CERTIFICATE OF CORRECTION

PATENT NO. : 5,414,726
DATED : May 9, 1995
INVENTOR(S) : Raj et al.

It is certified that error appears in the above-indentified patent and that said Letters Patent is hereby corrected as shown below:

On the title page: Item [73]Assignee: following information should be inserted with respect to the assignee: --France Telecom Etablissement Autonome De Droit Public--.

On the Item [56] the following information should be inserted with respect to the Attorney, Agent or Firm: --Pearne, Gordon, McCoy & Granger--.

On the Title page: in the abstract, line 7, delete "input".

Column 2, line 30, after "junction" insert --bias--; and
line 46, delete "cavity".

Column 3, lines 45 and 46, after "polarization" insert --or--.

Column 4, line 41, delete "mad" and insert --and--.

Column 8, line 66, delete ", The" and insert --Th--.

Column 14, line 40, delete "Klan" and insert --Kian--.

Column 15, line 1, delete "the" (second occurrence).

Column 16, line 63, after "obtain" insert --1--.

UNITED STATES PATENT AND TRADEMARK OFFICE
CERTIFICATE OF CORRECTION

PATENT NO. : 5,414,726
DATED : May 9, 1995
INVENTOR(S) : Raj et al.

It is certified that error appears in the above-indentified patent and that said Letters Patent is hereby corrected as shown below:

```
Column 18, line 31, after "light" insert --beam--; and
          line 32, after "of" insert --said--.
```

Signed and Sealed this

Nineteenth Day of December, 1995

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,414,726
DATED : May 9, 1995
INVENTOR(S) : Raj et al.

It is certified that error appears in the above-indentified patent and that said Letters Patent is hereby corrected as shown below:

On title page, item [73], the following information should be inserted with respect to the assignee: —France Telecom Etablissement Autonome De Droit Public—.

On title page, the following information should be inserted with respect to the Attorney, Agent or Firm: —Pearne, Gordon, McCoy & Granger—.

Item [57] Abstract, line 7, delete, "input".
Column 2, line 30, after "junction" insert —bias—; and
          line 46, delete "cavity".
Column 3, lines 45 and 46, after "polarization" insert —or—.
Column 4, line 41, delete "mad" and insert —and—.
Column 8, line 66, delete ", The" and insert —Th—.
Column 14, line 40, delete "Klan" and insert —Kian—.
Column 15, line 1, delete "the" (second occurrence).
Column 16, line 63, after "obtain" insert —a—
Column 18, line 31, after "light" insert —beam—; and
           line 32, after "of" insert —said—.

This certificate supersedes Certificate of Correction issued December 19, 1995.

Signed and Sealed this

Thirtieth Day of April, 1996

Attest:

BRUCE LEHMAN

Attesting Officer

Commissioner of Patents and Trademarks